United States Patent
Yu

(10) Patent No.: US 9,803,796 B2
(45) Date of Patent: Oct. 31, 2017

(54) QUARTZ CLIP DEVICE AND MANUFACTURING METHOD THEREOF AND OLED HIGH-TEMPERATURE OVEN HAVING SAME

(71) Applicant: Shenzhen China Star Optoelectronics Technology Co., Ltd., Shenzhen, Guangdong (CN)

(72) Inventor: Wei Yu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 511 days.

(21) Appl. No.: 14/356,216

(22) PCT Filed: Jan. 22, 2014

(86) PCT No.: PCT/CN2014/071142
§ 371 (c)(1),
(2) Date: May 5, 2014

(87) PCT Pub. No.: WO2015/096254
PCT Pub. Date: Jul. 2, 2015

(65) Prior Publication Data
US 2015/0184794 A1 Jul. 2, 2015

(30) Foreign Application Priority Data
Dec. 27, 2013 (CN) .......................... 2013 1 0739765

(51) Int. Cl.
*A21B 1/00* (2006.01)
*F16M 13/00* (2006.01)
(Continued)

(52) U.S. Cl.
CPC ....... *F16M 13/00* (2013.01); *H01L 21/67303* (2013.01); *H01L 21/67306* (2013.01);
(Continued)

(58) Field of Classification Search
CPC .............. F16M 13/00; H01L 21/67303; H01L 21/67306; H01L 21/67309; H05B 3/44; Y10T 29/49082
(Continued)

(56) References Cited

U.S. PATENT DOCUMENTS 3,915,656 A * 10/1975 Mlavsky ................. C30B 15/00
117/205
4,256,530 A * 3/1981 Schmid ................. C30B 11/002
117/13
(Continued)

FOREIGN PATENT DOCUMENTS

CN 1371527 A 9/2002
CN 1771588 A 5/2006
(Continued)

*Primary Examiner* — Arthur O Hall
*Assistant Examiner* — Adam J Rogers
(74) *Attorney, Agent, or Firm* — Andrew C. Cheng

(57) ABSTRACT

The present invention provides a quartz clip device and a manufacturing method thereof and an OLED high-temperature oven having the quartz clip device. The quartz clip device includes: a base (20), a plurality of quartz posts (30) mounted on the base (20), a quartz bottom board (40) arranged above the base (20), and a plurality of quartz plates (50) arranged above the quartz bottom board (40) and secured to the quartz posts (30). The quartz bottom board (40) includes a plurality of circular holes (42) formed therein to respectively correspond to the quartz posts (30). The circular holes (42) have a diameter that is slightly greater than a diameter of the quartz posts (30). The quartz posts (30) are received through he circular holes (42) and fastening members (60) are provided under the circular holes (42) to have the quartz bottom board (40) supported on the quartz posts (30). Slightly enlarging the diameter of the circular holes of the quartz bottom board ensures slight tipping of the quartz posts does not result in contact with the quartz bottom (Continued)

board so as to prevent cracking of the quartz bottom board from being caused by the contacts and affecting the production.

4 Claims, 7 Drawing Sheets

(51) Int. Cl.
  *H05B 3/44* (2006.01)
  *H01L 21/673* (2006.01)
(52) U.S. Cl.
  CPC ......... *H01L 21/67309* (2013.01); *H05B 3/44* (2013.01); *Y10T 29/49082* (2015.01)
(58) Field of Classification Search
  USPC ........................................................ 219/391
  See application file for complete search history.

(56) References Cited

U.S. PATENT DOCUMENTS

| | | | | |
|---|---|---|---|---|
| 5,671,799 A | * | 9/1997 | Merrill | .................. B22D 18/04 164/151 |
| 6,652,649 B1 | * | 11/2003 | Hearst | .................... C30B 11/00 117/200 |
| 2002/0113027 A1 | | 8/2002 | Minami et al. | |
| 2004/0061210 A1 | * | 4/2004 | Loo | .................. H01L 21/67309 257/684 |
| 2007/0006803 A1 | * | 1/2007 | Cadwell | ................. C30B 25/12 117/200 |
| 2007/0059128 A1 | * | 3/2007 | Yudovsky | ......... H01L 21/67757 414/217 |
| 2011/0309562 A1 | * | 12/2011 | Asari | .................... C23C 16/405 269/289 R |
| 2012/0217210 A1 | * | 8/2012 | Kubo | .................. H01L 21/6875 211/41.18 |
| 2013/0160704 A1 | * | 6/2013 | LaFontaine | ............. C30B 11/02 117/223 |
| 2015/0093231 A1 | * | 4/2015 | Broyer | .................. C30B 11/003 414/800 |
| 2015/0153105 A1 | * | 6/2015 | Yu | ............................. F27D 5/00 432/253 |

FOREIGN PATENT DOCUMENTS

| JP | 2000269150 A | 9/2000 |
|---|---|---|
| JP | 2000323423 A | 11/2000 |

* cited by examiner

QUARTZ CLIP DEVICE AND MANUFACTURING METHOD THEREOF AND OLED HIGH-TEMPERATURE OVEN HAVING SAME

BACKGROUND OF THE INVENTION

1. Field of the Invention

The present invention relates to the field of flat panel display, and in particular to a quartz clip device and a manufacturing method thereof and an OLED high-temperature oven having the quartz clip device.

2. The Related Arts

A flat panel display has a variety of advantages, including thin device body, reduced power consumption, and being free of radiation and is widely used. Flat panel displays that are currently available generally include liquid crystal displays (LCDs) and organic light emitting displays (OLEDs).

The OLEDs, which show the characteristics of self-illumination, high brightness, wide view angle, high contrast, flexibility, and low energy consumption, attract wide attention to serve as the next-generation display measure that gradually substitute the conventional liquid crystal display devices for applications in mobile phone screens, computer monitors, and full-color television. The OLED displaying, which is different from the conventional way of displaying with LED, requires no backlight and adopts extremely thin layers of organic coatings and glass substrates. These organic materials become luminous when electricity is conducted therethrough. However, the organic materials are sensitive to moisture and oxygen contained in the atmosphere and may readily get aging and change property due to moisture and oxygen, leading to significant deterioration of brightness and lifespan. Consequently, an OLED device, which is a display device manufactured based on the organic materials, must be subjected to extremely severe standard of packaging. In a packaging process of an OLED, good packaging result is vital to the lifespan of an OLED device.

UV resin that is commonly used in liquid crystal displays is not of sufficient capability of resisting penetration of moisture and oxygen and thus, frit is generally used for OLED packaging. Frit is generally composed of organic solvents and glass powders. In OLED packaging, the organic solvents are mixed with the glass powders to form an applicable paste, which is the coated to a lid for OLED packaging and placed in an OLED high-temperature oven for baking to evaporate the organic solvents, whereby polymerization occurs among the glass powders to become solid. The packaging lid with the solid frit carried thereon is assembled to a substrate for making an OLED device, followed by application of laser to melt the frit. Finally, the frit is allowed to solidify to complete the packaging of the two pieces of glass.

The OLED high-temperature oven that is used to bake the frit usually requires an extremely high temperature, such as being as high as 500-600° C., and an extended processing time. Thus, simultaneously placing multiple packaging substrates in the OLED high-temperature oven to bake may save the processing time for each individual substrate. Therefore, a solution that a quartz clip device is provided in the OLED high-temperature oven can be adopted to meet the need for simultaneously heat multiple substrate at a high temperature.

Referring to FIG. 1, which shows a conventional quartz clip device, the quartz clip device comprises multiple layers of quartz plates 100, a quartz bottom board 200, multiple quartz posts 400. The quartz plates 100 are provided for receiving substrates placed thereon in order to realize simultaneous high temperature heating of multiple substrates in the OLED high-temperature oven. The quartz bottom board 200 functions to help retain the quartz posts 400, preventing the quartz posts 400 from excessively tipping and also blocking heat flowing between processes carried out above and below the quartz bottom board 200 so as to ensure temperature consistency of each individual substrate on the quartz plates 100.

However, slight vibration may be induced when an entire completely-assembled quartz clip device is moved into the OLED high-temperature oven. As shown in FIGS. 2 and 3, the quartz posts 400 may slightly tip, making strong contacts with certain portions 500 of the quartz bottom board 200 so as to generate tiny cracks 600 in the quartz bottom board 200. Repeated increase and decrease of temperature during a manufacturing process would make the cracks 600 expand, eventually breaking the quartz bottom board 200.

SUMMARY OF THE INVENTION

An object of the present invention is to provide a quartz clip device, which has a simple structure and has circular holes that is formed in a quartz bottom board with an expanded diameter determined according to trigonometric formula in order to prevent the quartz bottom board from breaking resulting from cracks induced by contacts and prevent production from being affected by damage of facility and also to prevent undue enlargement of the diameter of the circular holes of the quartz bottom board to avoid inhomogeneity of temperature induced in a process proceeding above the quartz bottom board.

Another object of the present invention is to provide a manufacturing method of a quartz clip device, which method is simple and expands the diameter of circular holes formed in a quartz bottom board according to trigonometric formula in order to prevent the quartz bottom board from breaking resulting from cracks induced by contacts and prevent production from being affected by damage of facility and also to prevent undue enlargement of the diameter of the circular holes of the quartz bottom board to avoid inhomogeneity of temperature induced in a process proceeding above the quartz bottom board.

A further object of the present invention is to provide an OLED high-temperature oven that has a simple structure and includes circular holes that is formed in a quartz bottom board with an expanded diameter determined according to trigonometric formula in order to prevent the quartz bottom board from breaking resulting from cracks induced by contacts and prevent production from being affected by damage of facility and also to prevent undue enlargement of the diameter of the circular holes of the quartz bottom board to avoid inhomogeneity of temperature induced in a process proceeding above the quartz bottom board.

To achieve the objects, the present invention provides a quartz clip device, which comprises: a base, a plurality of quartz posts mounted on the base, a quartz bottom board arranged above the base, and a plurality of quartz plates arranged above the quartz bottom board and secured to the quartz posts. The quartz bottom board comprises a plurality of circular holes formed therein to respectively correspond to the quartz posts. The circular holes have a diameter slightly greater than a diameter of the quartz posts. The quartz posts are received through the circular holes. Fastening members are provided under the circular holes to have the quartz bottom board supported on the quartz posts.

The base comprises a plurality of retention sections respectively corresponding to the quartz posts. The quartz posts are mounted and fixed to the retention sections.

The quartz bottom board comprises a lower plate and an upper plate. The lower plate and the upper plate are integrally formed. The circular holes are through holes extending through the upper and lower plates. The lower plate is positioned on the fastening member.

The diameter of the circular holes is determined according to a formula: $D=d+2h*\arctan(\alpha)$, where d is the diameter of the quartz posts, h is height of the upper plate of the quartz bottom board with respect to the base, and $\alpha$ is a maximum tipping angle of the quartz posts after being mounted to the retention sections.

The present invention also provides a manufacturing method of a quartz clip device, which comprises the following steps:

(1) providing a base;

(2) providing a plurality of quartz posts and mounting the plurality of quartz posts to the base;

(3) providing a quartz bottom board and forming a plurality of circular holes in the quartz bottom board to respectively correspond to the quartz posts, the circular holes having a diameter that is slightly greater than a diameter of the quartz posts;

(4) mounting a fastening member to each of the quartz posts at a predetermined height with respect to the base and fitting the quartz bottom board through the circular holes to the quartz posts to be positioned on the fastening members thereby having the quartz bottom board supported on the quartz posts; and (5) providing a plurality of quartz plates and mounting the plurality of quartz plates to the quartz posts respectively at different heights so as to complete the manufacturing of a quartz clip device.

The base comprises a plurality of retention sections respectively corresponding to the quartz posts and the quartz posts are mounted to the retention sections. The quartz bottom board comprises a lower plate and an upper plate. The lower plate and the upper plate are integrally formed. The circular holes are through holes extending through the upper and lower plates.

The diameter of the circular holes is determined according to a formula: $D=d+2h*\arctan(\alpha)$, where d is the diameter of the quartz posts, h is height of the upper plate of the quartz bottom board with respect to the base, and $\alpha$ is a maximum tipping angle of the quartz posts after being mounted to the retention sections.

The present invention further provides an OLED high-temperature oven, which comprises: an oven body and a quartz clip device mounted in the oven body. The quartz clip device comprises a base, a quartz bottom board arranged above the base, and a plurality of quartz plates arranged above the quartz bottom board and secured to the quartz posts. The quartz bottom board comprises a plurality of circular holes formed therein to respectively correspond to the quartz posts. The circular holes have a diameter slightly greater than a diameter of the quartz posts. The quartz posts are received through the circular holes. Fastening members are provided under the circular holes to have the quartz bottom board supported on the quartz posts.

The base comprises a plurality of retention sections respectively corresponding to the quartz posts and the quartz posts are mounted to the retention sections. The quartz bottom board comprises a lower plate and an upper plate. The lower plate and the upper plate are integrally formed. The circular holes are through holes extending through the upper and lower plates. The lower plate is positioned on the fastening member.

The diameter of the circular holes is determined according to a formula: $D=d+2h*\arctan(\alpha)$, where d is the diameter of the quartz posts, h is height of the upper plate of the quartz bottom board with respect to the base, and $\alpha$ is a maximum tipping angle of the quartz posts after being mounted to the retention sections.

The efficacy of the present invention is that the present invention provides a quartz clip device and a manufacturing method thereof and an OLED high-temperature oven having the quartz clip device. The diameter of circular holes formed in a quartz bottom board is enlarged according to trigonometric formula in order to ensure slight tipping of the quartz posts does not result in contact with the quartz bottom board thereby protecting the quartz bottom board from cracks caused by the contacts, thereby preventing the quartz bottom board of a quartz clip device mounted in an OLED high-temperature oven from breaking and preventing production from being affected by damages of facility and also preventing the diameter of the circular holes of the quartz bottom board from becoming unduly large to cause inhomogeneity of temperature for the process above the quartz bottom board.

For better understanding of the features and technical contents of the present invention, reference will be made to the following detailed description of the present invention and the attached drawings. However, the drawings are provided for the purposes of reference and illustration and are not intended to impose undue limitations to the present invention.

BRIEF DESCRIPTION OF THE DRAWINGS

The technical solution, as well as beneficial advantages, of the present invention will be apparent from the following detailed description of an embodiment of the present invention, with reference to the attached drawings. In the drawings.

DETAILED DESCRIPTION OF THE PREFERRED EMBODIMENTS

Figure 1:
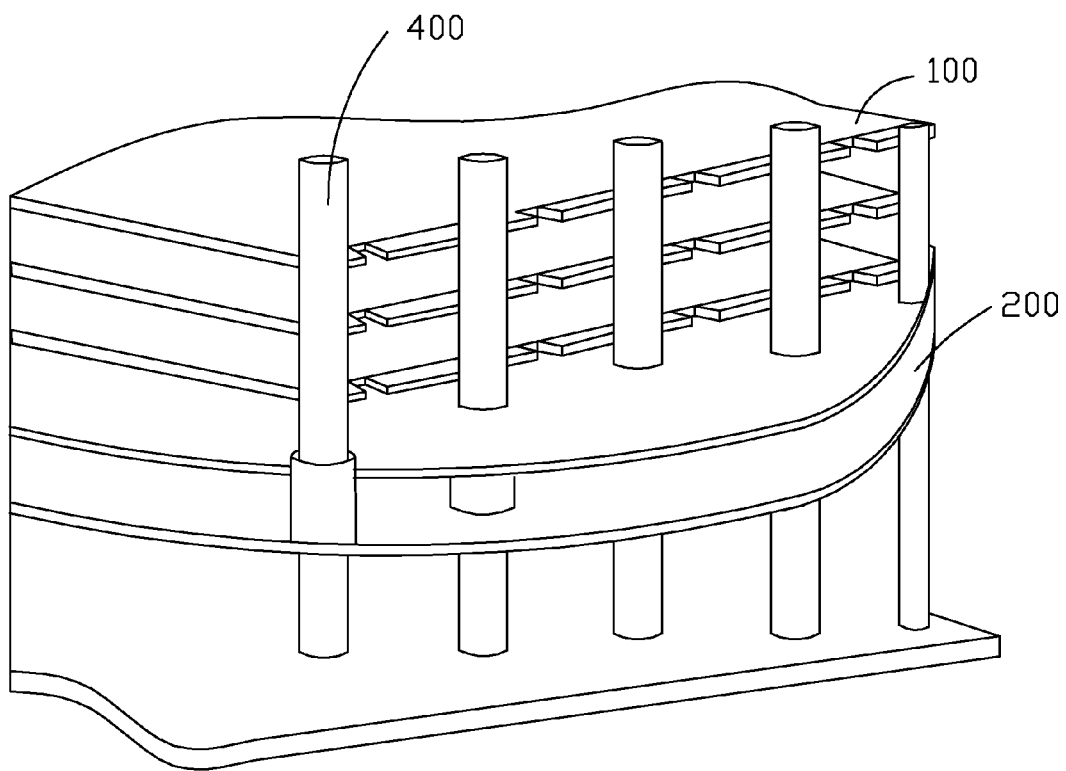
FIG. 1 is a schematic view showing the structure of a conventional quartz clip device.
Figure 2:
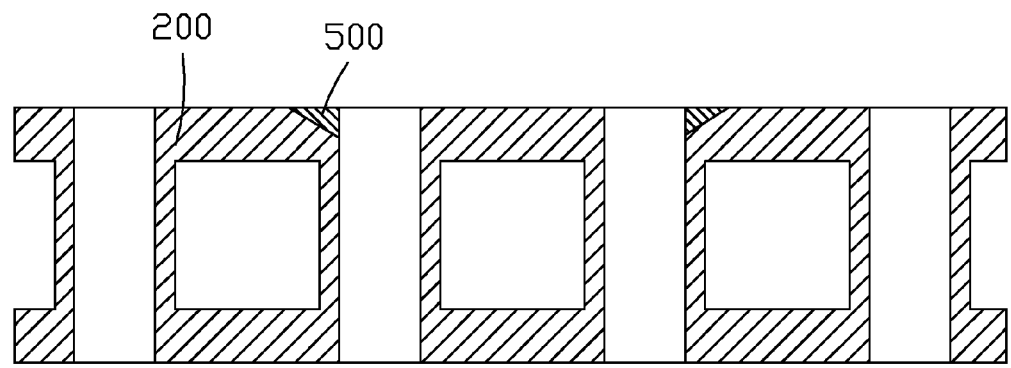
FIG. 2 is a cross-sectional view of a quartz bottom board of FIG. 1.
Figure 3:
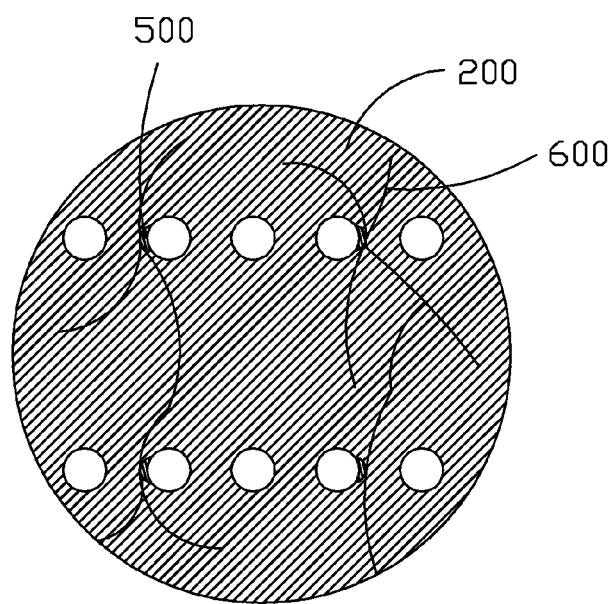
FIG. 3 is a top plan view of the quartz bottom board of FIG. 1.
Figure 4:
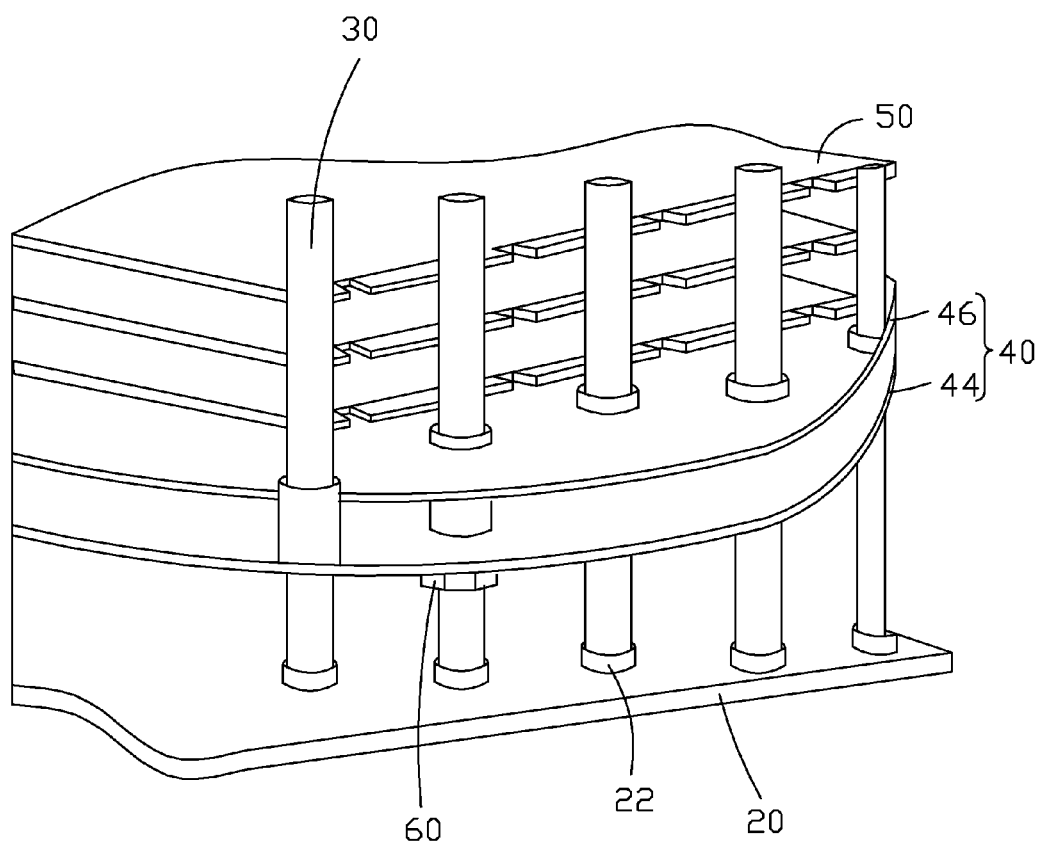
FIG. 4 is a schematic view showing the structure of a quartz clip device according to the present invention.
Figure 5:
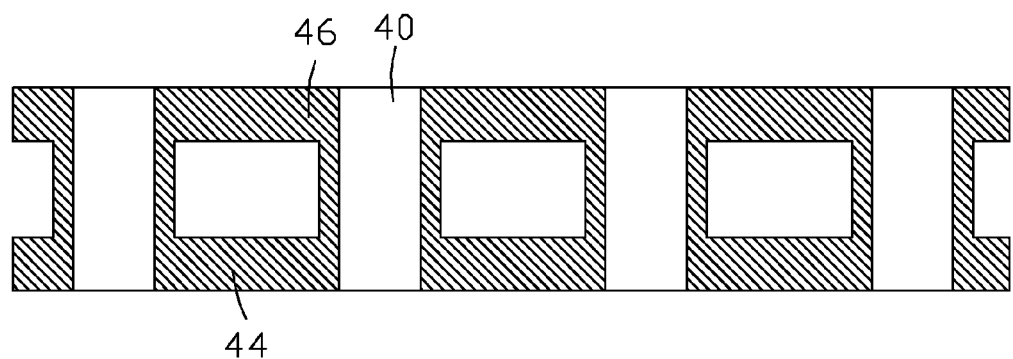
FIG. 5 is a cross-sectional view of a quartz bottom board of the quartz clip device according to the present invention.
Figure 6:
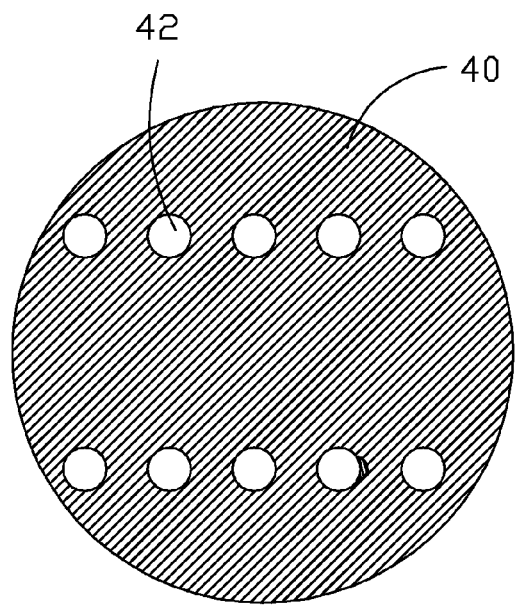
FIG. 6 is a top plan view of an upper plate of the quartz bottom board of the quartz clip device according to the present invention.

To further expound the technical solution adopted in the present invention and the advantages thereof, a detailed description is given to a preferred embodiment of the present invention and the attached drawings.

Referring to FIGS. 4-7, the present invention provides a quartz clip device, which comprises: a base 20, a plurality of quartz posts 30 mounted on the base 20, a quartz bottom board 40 arranged above the base 20, and a plurality of quartz plates 50 arranged above the quartz bottom board 40 and secured to the quartz posts 30.

The base 20 comprises a plurality of retention sections 22 respectively corresponding to the quartz posts 30. The quartz posts 30 are mounted and fixed to the retention sections 22.

The base 20 is made of a metal and in the instant embodiment, the base 20 is made of an iron based material. The retention sections 22 can be integrally formed with the base 20, or can alternatively mounted to the base 20 by means of welding. In the instant embodiment, the retention sections 22 and the base 20 are integrally formed together.

The quartz bottom board 40 comprises a lower plate 44 and an upper plate 46 and the lower plate 44 and the upper plate 46 are integrally formed. The quartz bottom board 40 comprises a plurality of circular holes 42 formed therein to respectively correspond to the quartz posts 30. The circular holes 42 can be through holes extending through the upper and lower plates 46, 44. The lower plate 44 and the upper plate 46 are connected to each other by means of cylinders that respectively define the through holes so as to constitute the quartz bottom board 40.

The quartz bottom board 40 functions to assist in fixing the quartz posts 30, so as to prevent the quartz posts 30 from excessively tipping and also to block heat from flowing between processes proceeding above and below the quartz bottom board 40, thereby ensuring temperature uniformity for substrates placed on the quartz plates 50.

The circular holes 42 have a diameter that is slightly greater than a diameter of the quartz posts 30. The quartz posts 30 are received through the circular holes 42 and fastening members 60 are provided under the circular holes 42 so that the lower plate 44 are positioned on the fastening members 60 to have the quartz bottom board 40 supported on the quartz posts 30.

The quartz plates 50 are provided with engagement sections corresponding to the quartz posts 30. The quartz plates 50 are mounted to the quartz posts 30 by means of the engagement sections. The quartz plates 50 function to receive substrates on which frit is coated for baking to be placed thereon. The quartz plates 50 are individually attached to different heights along the quartz posts 30 so as to achieve simultaneous high-temperature heating of multiple substrates in an OLED high-temperature oven.

Figure 7:
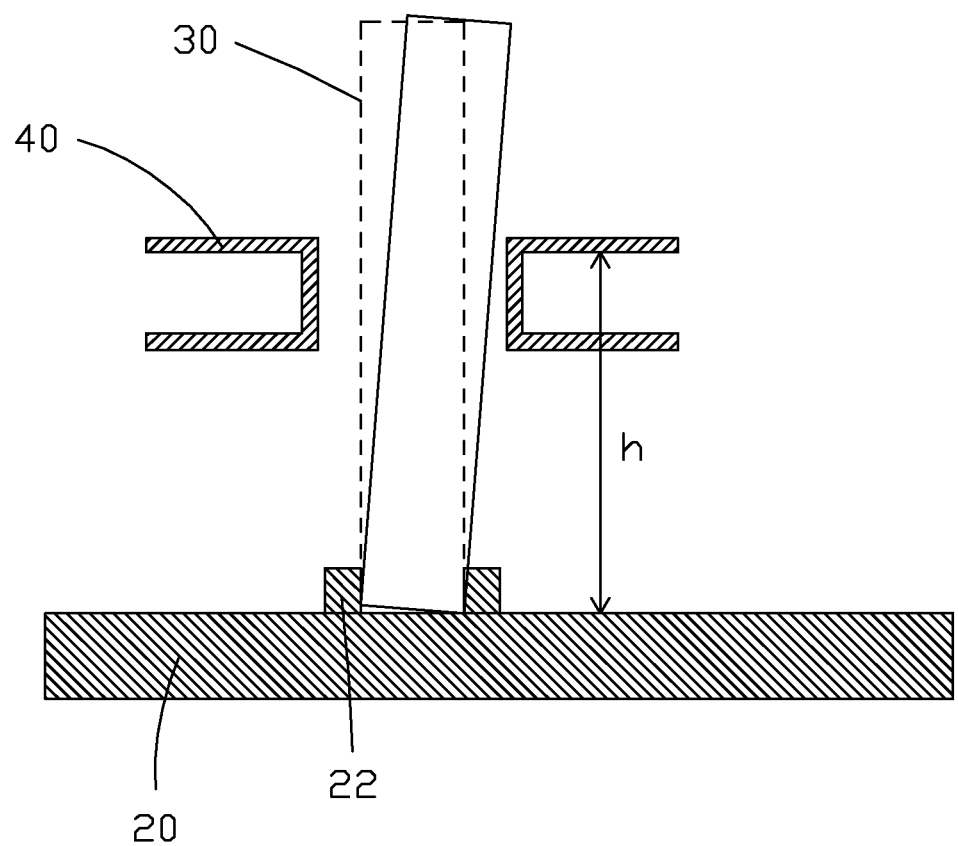
FIG. 7 is a schematic view illustrating the spatial relationship among a base, a quartz post, and the quartz bottom board of the quartz clip device according to the present invention.
Figure 8:
FIG. 8 is a view illustrating the principle of setting the diameter of a circular hole formed in the quartz bottom board of the quartz clip device according to the present invention.

Referring to FIG. 8, with additional reference to FIG. 7, the diameter of the circular holes 42 is set according to the formula $D=d+2x=d+2h*\arctan(\alpha)$, where D is the diameter of the circular holes 42 and d is the diameter of the quartz posts 30. Thus, the diameter of the circular holes 42 and that of the quartz posts 30 differ from each other by a value $\Delta d$, which is set according to the formula $\Delta d=2x=2h*\arctan(\alpha)$, where h is the distance between the upper plate 46 of the quartz bottom board 40 and the base 20, $\alpha$ is the maximum tipping angle of the quartz posts 30 after being mounted to the retention sections 22. Calculation can be made according to trigonometric formula to obtain a maximum possible shift distance x for the displacement of the quartz posts 30, so that the diameter D of the circular holes 42 can be obtained by adding 2x to the diameter d of the quartz posts 30. This ensures slight tipping of the quartz posts 30 does not result in contact with the quartz bottom board 40 thereby preventing cracks resulting from contact, while prevents the diameter of the circular holes 42 of the quartz bottom board 40 from becoming unduly large to cause inhomogeneity of temperature for the process above the quartz bottom board 40.

Figure 9:
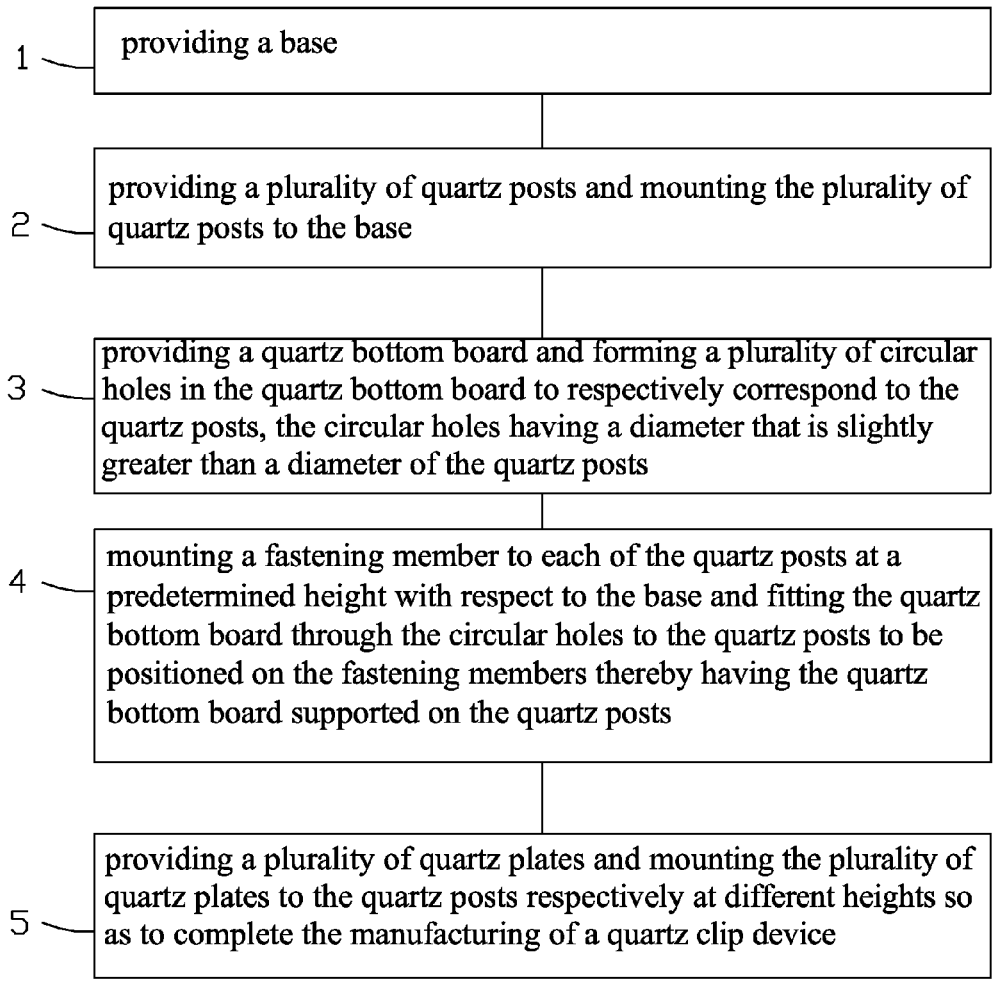
FIG. 9 is a flow chart illustrating a method for manufacturing a quartz clip device according to the present invention

Referring to FIG. 9, with additional reference to FIGS. 4-8, the present invention provides a manufacturing method of a quartz clip device, which comprises:

Step 1: providing a base 20.

The base 20 comprises a plurality of retention sections 22. The base 20 is made of a metal and in the instant embodiment, the base 20 is made of an iron based material. The retention sections 22 can be integrally formed with the base 20, or can alternatively mounted to the base 20 by means of welding. In the instant embodiment, the retention sections 22 and the base 20 are integrally formed together.

Step 2: providing a plurality of quartz posts 30 and mounting the plurality of quartz posts 30 to the base 20.

The plurality of retention sections 22 is arranged to respectively correspond to the quartz posts 30 and the quartz posts 30 are mounted and fixed to the retention sections 22.

Step 3: providing a quartz bottom board 40 and forming a plurality of circular holes 42 in the quartz bottom board 40 to respectively correspond to the quartz posts 30, the circular holes 42 having a diameter that is slightly greater than a diameter of the quartz posts 30.

The quartz bottom board 40 comprises a lower plate 44 and an upper plate 46 and the lower plate 44 and the upper plate 46 are integrally formed. The circular holes 42 are through holes extending through the upper and lower plates 46, 44. The lower plate 44 and the upper plate 46 are connected to each other by means of cylinders that respectively define the through holes so as to constitute the quartz bottom board 40.

The quartz bottom board 40 functions to assist in fixing the quartz posts 30, so as to prevent the quartz posts 30 from excessively tipping and also to block heat from flowing between processes proceeding above and below the quartz bottom board 40.

Step 4: mounting a fastening member 60 to each of the quartz posts 30 at a predetermined height with respect to the base 20 and fitting the quartz bottom board 40 through the circular holes 42 to the quartz posts 30 to be positioned on the fastening members 60 thereby having the quartz bottom board 40 supported on the quartz posts 30.

The fastening members 60 are arranged under the circular holes 42.

Step 5: providing a plurality of quartz plates 50 and mounting the plurality of quartz plates 50 to the quartz posts 30 respectively at different heights so as to complete the manufacturing of a quartz clip device.

The quartz plates 50 are provided with engagement sections corresponding to the quartz posts 30. The quartz plates 50 are mounted to the quartz posts 30 by means of the engagement sections. The quartz plates 50 function to receive substrates on which frit is coated for baking to be placed thereon so as to achieve simultaneous high-temperature heating of multiple substrate in an OLED high-temperature oven.

The diameter of the circular holes 42 is set according to the formula $D=d+2x=d+2h*\arctan(\alpha)$, where D is the diameter of the circular holes 42 and d is the diameter of the quartz posts 30. Thus, the diameter of the circular holes 42 and that of the quartz posts 30 differ from each other by a value Δd, which is set according to the formula Δd=2x=2h*arctan(α), where h is the distance between the upper plate 46 of the quartz bottom board 40 and the base 20, α is the maximum tipping angle of the quartz posts 30 after being mounted to the retention sections 22. Calculation can be made according to trigonometric formula to obtain a maximum possible shift distance x for the displacement of the quartz posts 30, so that the diameter D of the circular holes 42 can be obtained by adding 2x to the diameter d of the quartz posts 30. This ensures slight tipping of the quartz posts 30 does not result in contact with the quartz bottom board 40 thereby preventing cracks resulting from contact, while prevents the diameter of the circular holes 42 of the quartz bottom board 40 from becoming unduly large to cause inhomogeneity of temperature for the process above the quartz bottom board 40.

Figure 10:
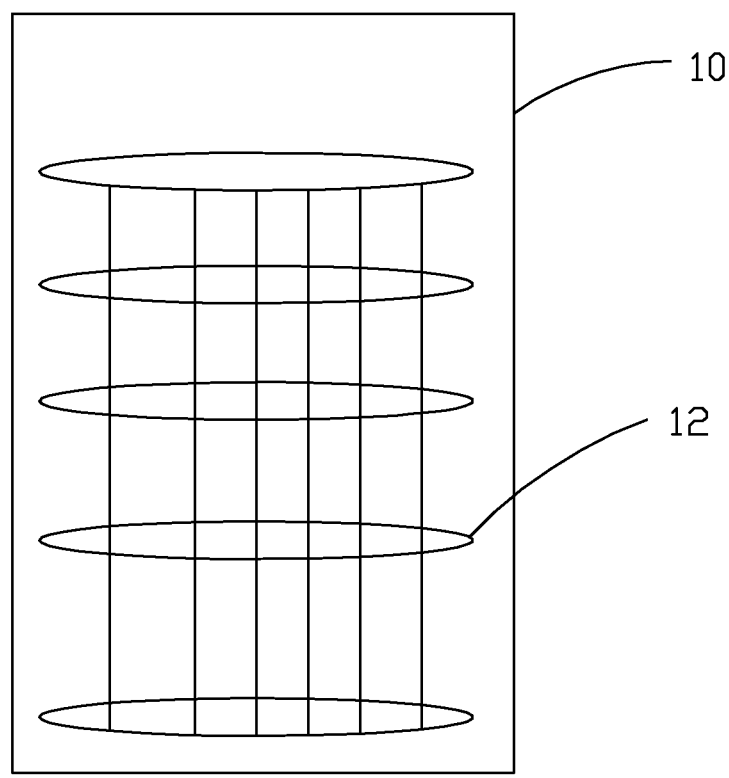
FIG. 10 is a schematic view showing the structure of an OLED high-temperature oven having the quartz clip device according to the present invention.

Referring to FIG. 10, with additional reference to FIGS. 4-8, the present invention provides an OLED high-temperature oven, which comprises: an oven body 10 and a quartz clip device 12 mounted in the oven body 10. The quartz clip device 12 comprises a base 20, a plurality of quartz posts 30 mounted on the base 20, a quartz bottom board 40 arranged above the base 20, and a plurality of quartz plates 50 arranged above the quartz bottom board 40 and secured to the quartz posts 30.

The base 20 comprises a plurality of retention sections 22 respectively corresponding to the quartz posts 30. The quartz posts 30 are mounted and fixed to the retention sections 22.

The base 20 is made of a metal and in the instant embodiment, the base 20 is made of an iron based material. The retention sections 22 can be integrally formed with the base 20, or can alternatively mounted to the base 20 by means of welding. In the instant embodiment, the retention sections 22 and the base 20 are integrally formed together.

The quartz bottom board 40 comprises a lower plate 44 and an upper plate 46 and the lower plate 44 and the upper plate 46 are integrally formed. The quartz bottom board 40 comprises a plurality of circular holes 42 formed therein to respectively correspond to the quartz posts 30. The circular holes 42 can be through holes extending through the upper and lower plates 46, 44. The lower plate 44 and the upper plate 46 are connected to each other by means of cylinders that respectively define the through holes so as to constitute the quartz bottom board 40.

The quartz bottom board 40 functions to assist in fixing the quartz posts 30, so as to prevent the quartz posts 30 from excessively tipping and also to block heat from flowing between processes proceeding above and below the quartz bottom board 40, thereby ensuring temperature uniformity for substrates placed on the quartz plates 50.

The circular holes 42 have a diameter that is slightly greater than a diameter of the quartz posts 30. The quartz posts 30 are received through the circular holes 42 and fastening members 60 are provided under the circular holes 42 so that the lower plate 44 are positioned on the fastening members 60 to have the quartz bottom board 40 supported on the quartz posts 30.

The quartz plates 50 are provided with engagement sections corresponding to the quartz posts 30. The quartz plates 50 are mounted to the quartz posts 30 by means of the engagement sections. The quartz plates 50 function to receive substrates on which frit is coated for baking to be placed thereon. The quartz plates 50 are individually attached to different heights along the quartz posts 30 so as to achieve simultaneous high-temperature heating of multiple substrate in an OLED high-temperature oven.

The diameter of the circular holes 42 is set according to the formula D=d+2x=d+2h*arctan(α), where D is the diameter of the circular holes 42 and d is the diameter of the quartz posts 30. Thus, the diameter of the circular holes 42 and that of the quartz posts 30 differ from each other by a value Δd, which is set according to the formula Δd=2x=2h*arctan(α), where h is the distance between the upper plate 46 of the quartz bottom board 40 and the base 20, α is the maximum tipping angle of the quartz posts 30 after being mounted to the retention sections 22. Calculation can be made according to trigonometric formula to obtain a maximum possible shift distance x for the displacement of the quartz posts 30, so that the diameter D of the circular holes 42 can be obtained by adding 2x to the diameter d of the quartz posts 30. This ensures slight tipping of the quartz posts 30 does not result in contact with the quartz bottom board 40 thereby preventing cracks resulting from contact, while prevents the diameter of the circular holes 42 of the quartz bottom board 40 from becoming unduly large to cause inhomogeneity of temperature for the process above the quartz bottom board 40.

In summary, the present invention provides a quartz clip device and a manufacturing method thereof and an OLED high-temperature oven having the quartz clip device. The diameter of circular holes formed in a quartz bottom board is enlarged according to trigonometric formula in order to ensure slight tipping of the quartz posts does not result in contact with the quartz bottom board thereby protecting the quartz bottom board from cracks caused by the contacts, thereby preventing the quartz bottom board of a quartz clip device mounted in an OLED high-temperature oven from breaking and preventing production from being affected by damages of facility and also preventing the diameter of the circular holes of the quartz bottom board from becoming unduly large to cause inhomogeneity of temperature for the process above the quartz bottom board.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A quartz clip device, comprising: a base, a plurality of quartz posts mounted on the base and each extending in an axial direction, a quartz bottom board arranged above the base, and a plurality of quartz plates arranged above and spaced from the quartz bottom board and secured to the quartz posts, the quartz bottom board comprising a plurality of circular holes formed therein to respectively correspond to and receive the quartz posts, the circular holes having a diameter greater than a diameter of the quartz posts such that a space is formed between an inner circumference of each of the circular holes and an outer circumference of the corresponding one of the quartz posts, the quartz posts being received and completely extending through the circular holes, fastening members being provided under the circular holes to have the quartz bottom board supported on the quartz posts, wherein the space between the inner circumference of the circular hole of the bottom board and the outer circumference of the quartz post has a predetermined size to accommodate the diameter of the quartz post and allow for a sideway displacement of the quartz post within the circular hole in a sideway direction that is substantially perpendicular to the axial direction thereof caused by tipping of the quartz post with respect to the circular hole of the bottom board, wherein the predetermined size of the space between the inner circumference of the circular hole of the bottom board and the outer circumference of the quartz post is greater than the displacement of a portion of the quartz post that corresponds to an upper circumferential edge of the circular hole of the bottom board caused by the tipping of the quartz post so as to prevent the portion of the quartz post from contacting the upper circumferential edge of the circular hole.

2. The quartz clip device as claimed in claim 1, wherein the base comprises a plurality of retention sections respectively corresponding to the quartz posts, the quartz posts being mounted and fixed to the retention sections.

3. The quartz clip device as claimed in claim 2, wherein the quartz bottom board comprises a lower plate and an upper plate, the lower plate and the upper plate being integrally formed, the circular holes being through holes extending through the upper and lower plates, the lower plate being positioned on the fastening member.

4. The quartz clip device as claimed in claim 3, wherein the diameter of the circular holes is determined according to a formula: $D=d+2h*\arctan(\alpha)$, where d is the diameter of the quartz posts, h is height of the upper plate of the quartz bottom board with respect to the base, and $\alpha$ is a maximum tipping angle of the quartz posts after being mounted to the retention sections.

* * * * *